(12) United States Patent
Koimori et al.

(10) Patent No.: US 7,046,091 B2
(45) Date of Patent: May 16, 2006

(54) POWER AMPLIFIER

(75) Inventors: Toshiyuki Koimori, Kanagawa (JP); Tomokazu Yamauchi, Kanagawa (JP)

(73) Assignee: Sony Corporation, (JP)

( * ) Notice: Subject to any disclaimer, the term of this patent is extended or adjusted under 35 U.S.C. 154(b) by 63 days.

(21) Appl. No.: 10/797,198

(22) Filed: Mar. 11, 2004

(65) Prior Publication Data

US 2004/0189394 A1    Sep. 30, 2004

(30) Foreign Application Priority Data

Mar. 27, 2003  (JP)  ............................ P2003-088542

(51) Int. Cl.
*H03F 3/04*  (2006.01)

(52) U.S. Cl. .................................... 330/289
(58) Field of Classification Search ................ 330/289, 330/296, 277, 307, 285; 327/513
See application file for complete search history.

(56) References Cited

U.S. PATENT DOCUMENTS 5,659,264 A * 8/1997 Ariyoshi et al. ............ 327/513
6,087,888 A * 7/2000 Inokuchi ..................... 327/513
6,239,625 B1 * 5/2001 Abe ............................. 327/58
6,329,879 B1 * 12/2001 Maruyama et al. ......... 330/289

FOREIGN PATENT DOCUMENTS

JP           06-120414          4/1994

* cited by examiner

*Primary Examiner*—Robert Pascal
*Assistant Examiner*—Hieu Nguyen
(74) *Attorney, Agent, or Firm*—Rader, Fishman,& Grauer PLLC; Ronald P. Kananen (57) ABSTRACT

A power amplifier able to minimize the deterioration of the linearity with respect to fluctuations in ambient temperature, wherein a first terminal of a first resistance element and a first terminal of a second resistance with a temperature coefficient smaller than that of the first resistance element are connected, the connection point is connected to a gate terminal of an FET, a second terminal of the first resistance element is connected to a bias voltage supply terminal, a second terminal of the second resistance element is connected to the ground potential, a drain terminal of the FET is connected to a power source voltage supply terminal, a source terminal is connected to the ground potential, and the FET and the first resistance element are constituted by semiconductor devices formed on the same semiconductor substrate.

9 Claims, 8 Drawing Sheets

POWER AMPLIFIER

BACKGROUND OF THE INVENTION

1. Field of the Invention

The present invention relates to a power amplifier applied for example to a transmitter of a wireless communication system, more particularly relates to an improvement of a bias circuit setting the bias current.

2. Description of the Related Art

The bias current of a power amplifier is a very important factor determining its characteristics. Especially, power amplifiers for transmission used for digital mobile phones etc. require high linearity, so the setting of the bias current is becoming extremely important.

Figure 1:
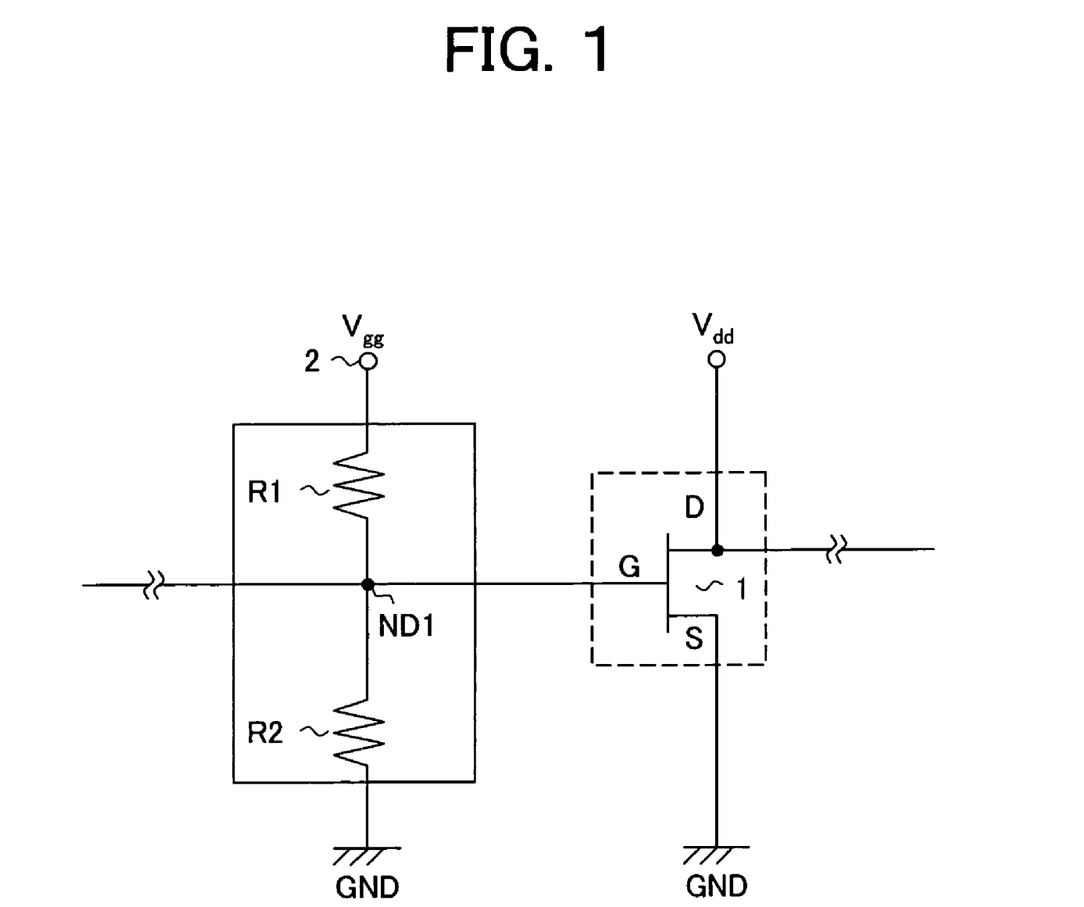
FIG. 1 is a circuit diagram of a general bias circuit of a power amplifier.

FIG. 1 is a circuit diagram of a general bias circuit of a power amplifier disclosed in, for example, Japanese Unexamined Patent Publication (Kokai) No. 6-120414.

As shown in FIG. 1, the bias circuit has a field effect transmitter (FET) 1, a bias voltage supply terminal 2 of a gate bias voltage Vgg, a resistance element R1, and a resistance element R2. In the bias circuit of FIG. 1, the resistance element R1 and the resistance element R2 are connected in series between the bias voltage supply terminal 2 and the ground GND, and the connection point of the resistance element R1 and R2 is connected to a gate terminal G of the FET 1. A drain terminal D of the FET 1 is connected to a supply line of a power source voltage Vdd, and a source terminal S of the FET 1 is grounded. The gate bias voltage Vgg is supplied from the bias voltage supply terminal 2 to set the bias current.

Summarizing the problems to be solved by the invention, the above power amplifier does not suffer from any problems at room temperature, but if the ambient temperature changes, there is the problem that the bias current of the power amplifier changes greatly from the setting at room temperature especially at low temperature or high temperature. As a result, the linearity of the power amplifier remarkably deteriorates.

SUMMARY OF THE INVENTION

An object of the present invention is to provide a power amplifier able to minimize the deterioration of the linearity with respect to the ambient temperature.

To attain the above object, according to a first aspect of the present invention, there is provided a power amplifier comprising a field effect transistor, a bias voltage supply terminal supplied with a bias voltage, a reference potential, a first resistance element, and a second resistance element with a temperature coefficient smaller than that of the first resistance element, wherein a first terminal of the first resistance element and a first terminal of the second resistance element are connected, a connection point of those terminals is connected to a gate terminal of the field effect transistor, a second terminal of the first resistance element is connected to the bias voltage supply terminal, a second terminal of the second resistance element is connected to the reference potential, and the field effect transistor and the first resistance element are semiconductor devices formed on the same semiconductor substrate.

Preferably, a resistance value of the second resistance element is variable.

According to a second aspect of the present invention, there is provided a power amplifier comprising a field effect transistor, a bias voltage supply terminal supplied with a bias voltage, a reference potential, a first resistance element, a second resistance element, and a third resistance element with a temperature coefficient smaller than those of the first resistance element and the record resistance element, wherein a first terminal of the first resistance element and a first terminal of the second resistance element are connected, a connection point of those terminals is connected to a gate terminal of the field effect transistor, a second terminal of the second resistance element is connected to a first terminal of the third resistance element, a second terminal of the first resistance element is connected to the bias voltage supply terminal, a second terminal of the third resistance element is connected to the reference voltage, and the field effect transistor, the first resistance element, and the second resistance element are semiconductor devices formed on the same semiconductor substrate.

Preferably, a resistance value of the third resistance element is variable.

According to a third aspect of the preset invention, there is provided a power amplifier, comprising a field effect transistor, a bias voltage supply terminal supplied with a bias voltage, a reference potential, a first resistance element, a second resistance with a temperature coefficient smaller than that of the first resistance element, and a third resistance element with a temperature coefficient smaller than that of the first resistance element, wherein a first terminal of the first resistance element and a first terminal of the second resistance element are connected, a second terminal of the second resistance element and a first terminal of the third resistance element are connected, a connection point of those terminals is connected to a gate terminal of the field effect transistor, a second terminal of the first resistance element is connected to the bias voltage supply terminal, a second terminal of the third resistance element is connected to the reference potential, and the field effect transistor and the first resistance element are semiconductor devices formed on the same semiconductor substrate.

Preferably, a resistance value of the third resistance element is variable.

According to the first aspect of the present invention, since the temperature coefficient of resistance of the first resistance element at the bias voltage supply side is larger than that of the second resistance element at the ground side, the voltages supplied to the gate terminal of the FET change in accordance with changes of the ambient temperature. Due to this, the power amplifier is supplied-with the optimum bias voltages in accordance with each temperature. As a result, it is possible to prevent the deterioration of the basic characteristics, especially the linearity. Further, since the FET and the first resistance element are formed on the same semiconductor substrate, it is possible to reduce-the number of parts in comparison with bias circuits constituted by so-called chip resistors. Accordingly, there is the advantage that the size of the power amplifier can be reduced. Note that by configuring the second resistance element so that the temperature coefficient is smaller than that of the first resistance element and the resistance value is variable, it becomes possible to adjust the bias current to any set value.

According to the second aspect of the present invention, since the temperature coefficients of resistance of the first resistance element and the second resistance element at the bias voltage supply side are larger than that of the third resistance element at the ground side, the voltages supplied to the gate terminal of the FET change in accordance with the change of the ambient temperature. Due to this, the power amplifier is supplied with the optimum bias voltage in accordance with each temperature. As a result, it is possible to prevent deterioration of the basic characteristics, especially the linearity. Further, since the FET, the first resistance element, and the second resistance element are formed on the same semiconductor substrate, it is possible to reduce the number of the parts in comparison with bias circuits constituted by so-called chip resistors. Accordingly, there is the advantage that the size of the power amplifier can be reduced. Note that by configuring the third resistance element so that the temperature coefficient is smaller than those of the first resistance element and the second resistance element and the resistance value is variable, it becomes possible to adjust the bias current to any set value.

According to the third aspect of the present invention, since the temperature coefficient of resistance of the first resistance element at the bias voltage supply side is larger than those of the second resistance element and the third resistance element at the ground side, the voltages supplied to the gate terminal of the FET change in accordance with changes of the ambient temperature. Due to this, the power amplifier is supplied with the optimum bias voltage in accordance with each temperature. As a result, it is possible to prevent the deterioration of the basic characteristics, especially the linearity. Further, since the FET and the first resistance element are formed on the same semiconductor substrate, it is possible to reduce the number of the parts in comparison with bias circuits constituted by so-called chip resistors. Accordingly, there is the advantage that the size of the power amplifier can be reduced. Note that by configuring the second resistance element and the third resistance element so that temperature coefficients are smaller than that of the first resistance element and the resistance values are variable, it becomes possible to adjust the bias current to any set value.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, an explanation will be given of embodiments of the present invention with reference to the drawings.

First Embodiment

Figure 2:
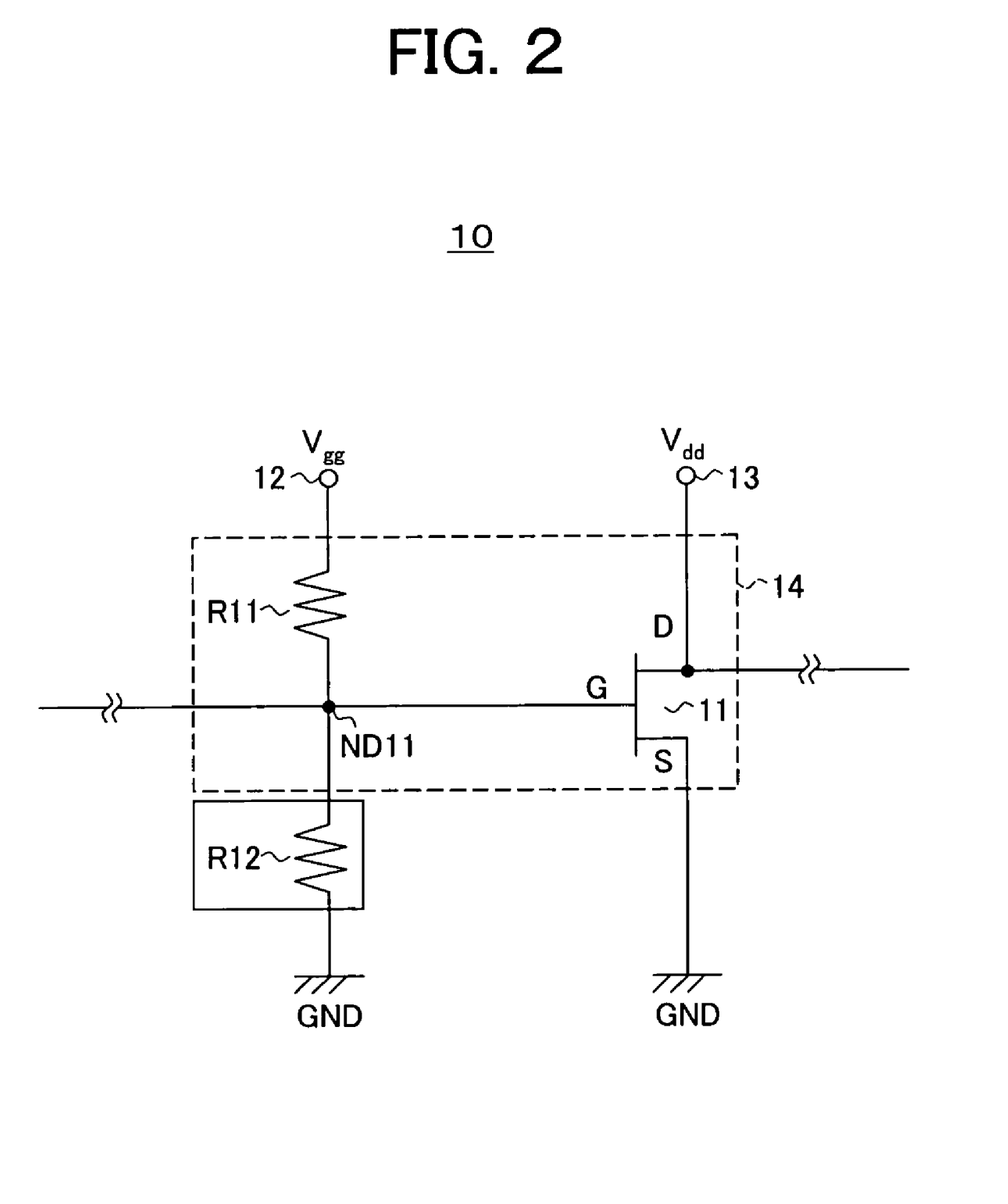
FIG. 2 is a circuit diagram of a power amplifier according to a first embodiment of the present invention.

FIG. 2 is a circuit diagram of a power amplifier according to a first embodiment of the present invention.

The power amplifier 10 has, as shown in FIG. 2, a FET (field effect transistor) 11, a bias voltage supply terminal 12 supplied with a plus voltage Vgg, a power source voltage supply terminal 13 supplied with a power source voltage Vdd, a ground potential (reference potential) GND, a first resistance element R11, and a second resistance element R12 with a temperature coefficient smaller than that of the first resistance element R11.

A first terminal of the first resistance element R11 and a first terminal of the second resistance element R12 are connected and the connection point ND11 is connected to a gate terminal G of the FET 11. A second terminal of the first resistance element R11 is connected to the bias voltage supply terminal 12, and a second terminal of the second resistance element R12 is connected to the ground potential GND. A drain terminal D of the FET 11 is connected to the power source voltage supply terminal 13, and a source terminal S is connected to the ground potential GND. The FET 11 and the first resistance element R11 are semiconductor devices formed on the same semiconductor substrate 14.

In this power amplifier 10, since the temperature coefficient of resistance of the first resistance element R11 at the bias voltage supply side is larger than that of the second resistance element R12 at the ground side, the voltages supplied to the gate terminal G of the FET 11 change in accordance with changes of the ambient temperature. Due to this, the power amplifier 10 is supplied with the optimum bias voltages in accordance with each temperature. As a result, it is possible to prevent the deterioration of the basic characteristics, especially the linearity. Further, since the FET 11 and the first resistance element R11 are formed on the same semiconductor substrate 14, it is possible to reduce the number of parts in comparison with bias circuits constituted by so-called chip resistors. Accordingly, there is an advantage that the size of the power amplifier can be reduced.

Note that by configuring the second resistance element R12 so that the temperature coefficient is smaller than that of the first resistance element R11 and the resistance value is variable, it becomes possible to adjust the bias current to any set value.

Second Embodiment

Figure 3:
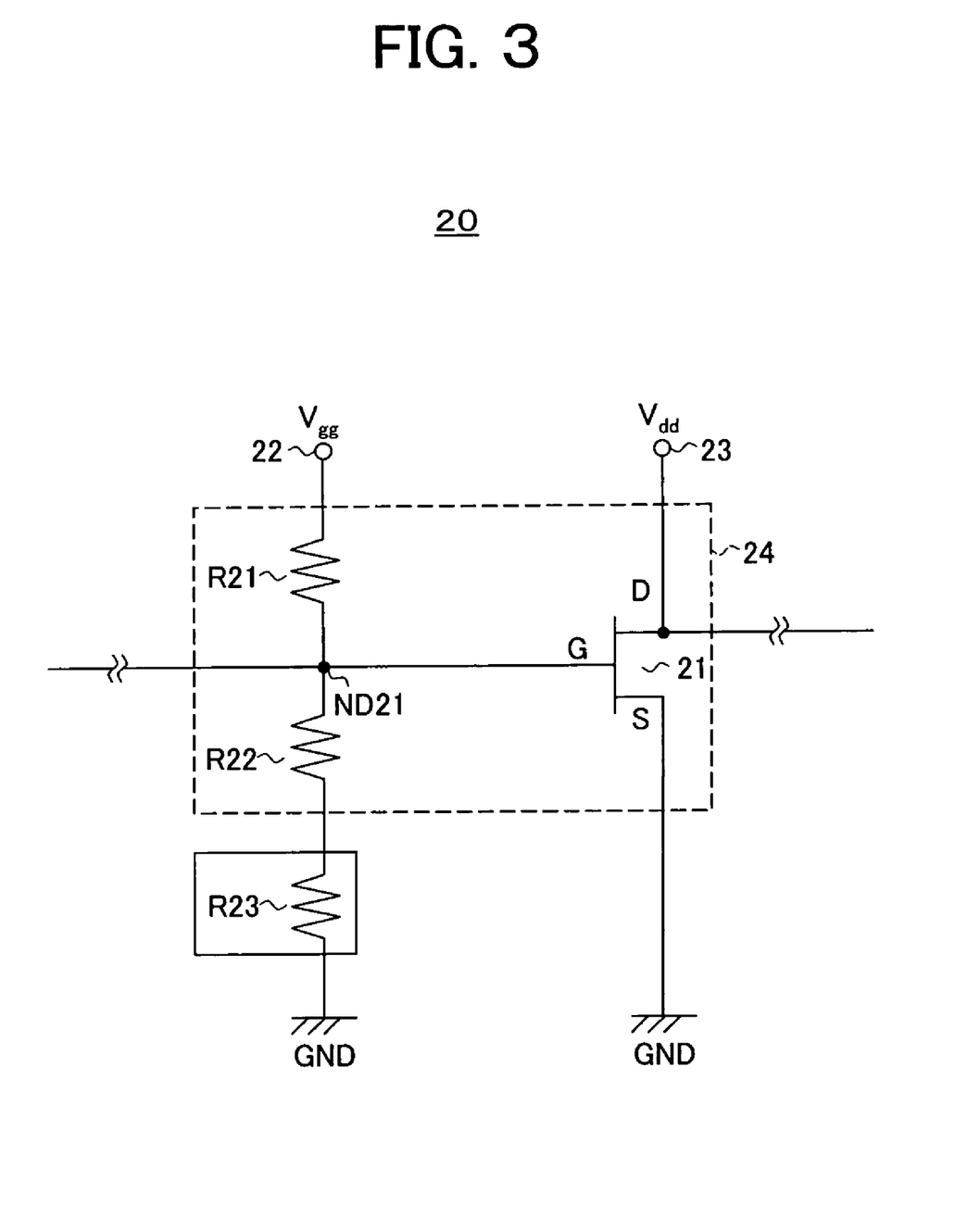
FIG. 3 is a circuit diagram of a power amplifier according to a second embodiment of the present invention.

FIG. 3 is a circuit diagram of a power amplifier according to a second embodiment of the present invention.

The power amplifier 20 has, as shown in FIG. 3, a FET (field effect transistor) 21, a bias voltage supply terminal 22 supplied with a plus bias voltage Vgg, a power source voltage supply terminal 23 supplied with a power source voltage Vdd, a ground potential (reference potential) GND, a first resistance element R21, a second resistance element R22, and a third resistance element R23 with a temperature coefficient smaller than those of the first resistance element R21 and the second resistance element R22.

A first terminal of the first resistance element R21 and a first terminal of the second resistance element R22 are connected and the connection point ND21 is connected to a gate terminal G of the FET 21. A second terminal of the second resistance element R22 is connected to a first terminal of the third resistance element 23, a second terminal of the first resistance element R21 is connected to the bias voltage supply terminal 22, and a second terminal of the third resistance element R23 is connected to the ground potential GND. A drain terminal D of the FET 21 is connected to the power source voltage supply terminal 23, and source terminal S is connected to the ground potential GND. The FET 21, the first resistance element R21, and the second resistance element R22 are semiconductor devices formed on the same semiconductor substrate 24.

In this power amplifier 20, since the temperature coefficients of resistance of the first resistance element R21 and the second resistance element R22 at the bias voltage supply side are larger than that of the third resistance element R23 at the ground side, the voltages supplied to the gate terminal G of the FET 21 change in accordance with changes of the ambient temperature. Due to this, the power amplifier 20 is supplied with the optimum bias voltage in accordance with each temperature. As a result, it is possible to prevent the deterioration of the basic characteristics, especially the linearity. Further, since the FET 21, the first resistance element R21, and the second resistance element R22 are formed on the same semiconductor substrate 24, it is possible to reduce the number of parts in comparison with bias circuits constituted by so-called chip resistors. Accordingly, there is the advantage that the size of the power amplifier can be reduced.

Note that by configuring the third resistance element R23 so that the temperature coefficient is smaller than those of the first resistance element R21 and the second resistance element R22 and the resistance value is variable, it becomes possible to adjust the bias current to any set value.

Third Embodiment

Figure 4:
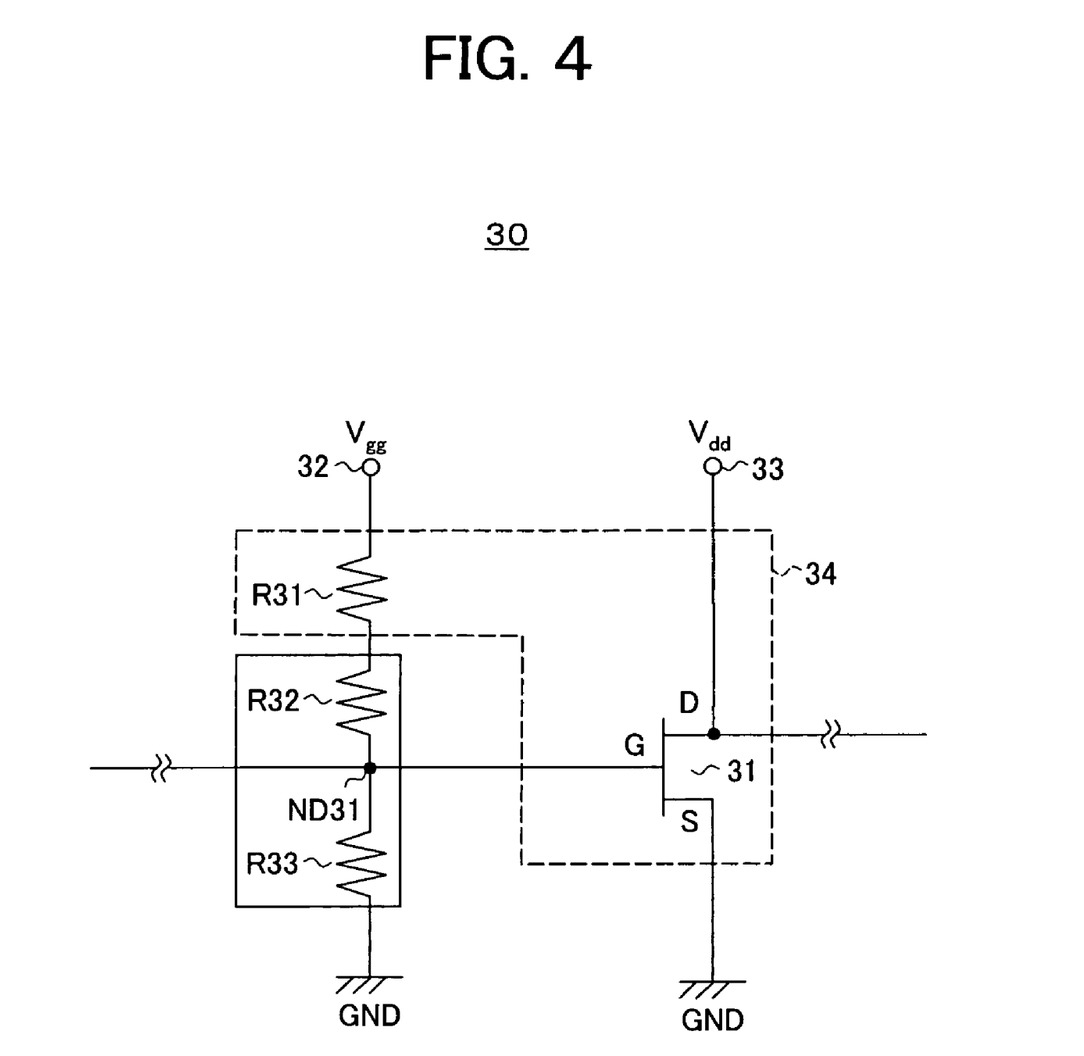
FIG. 4 is a circuit diagram of a power amplifier according to a third embodiment of the present invention.

FIG. 4 is a circuit diagram of a power amplifier according to a third embodiment of the present invention.

The power amplifier 30 has, as shown in FIG. 4, a FET (field effect transistor) 31, a bias voltage supply terminal 32 supplied with a plus bias voltage Vgg, a power source voltage supply terminal 33 supplied with a power source voltage Vdd, a ground potential (reference potential) GND, a first resistance element R31, a second resistance element R32 with a temperature coefficient smaller than that of the first resistance element R31, and a third resistance element R33 with a temperature coefficient smaller than that of the first resistance element R31.

A first terminal of the first resistance element R31 and a first terminal of the second resistance element R32 are connected, a second terminal of the second resistance element R32 is connected to a first terminal of the third resistance element R33, and the connection point ND31 is connected to a gate terminal G of the FET 31. A second terminal of the first resistance element R31 is connected to the bias voltage supply terminal 32, and a second terminal of the third resistance element R33 is connected to the ground potential GND. A drain terminal D of the FET 31 is connected to the power source voltage supply terminal 33, and a source terminal S is connected to the ground potential GND. The FET 31 and the first resistance element R31 are semiconductor devices formed on the same semiconductor substrate 34.

In this power amplifier 30, since the temperature coefficient of resistance of the first resistance element R31 at the bias voltage supply side is larger than those of the second resistance element R32 and the third resistance element R33 at the ground side, the voltages supplied to the gate terminal G of the FET31 change in accordance with changes of the ambient temperature. Due to this, the power amplifier 30 is supplied with the optimum bias voltage in accordance with each temperature. As a result, it is possible to prevent the deterioration of the basic characteristics, especially the linearity. Further, since the FET 31 and the first resistance element R31 are formed on the same semiconductor substrate 34, it is possible to reduce the number of parts in comparison with bias circuits constituted by so-called chip resistors. Accordingly, there is the advantage that the size of the power amplifier can be reduced.

Note that by configuring the second resistance element R32 and the third resistance element R33 so that temperature coefficients are smaller than that of the first resistance element R31 and the resistance values are variable, it becomes possible to adjust the bias current to any set value.

Fourth Embodiment

Figure 5:
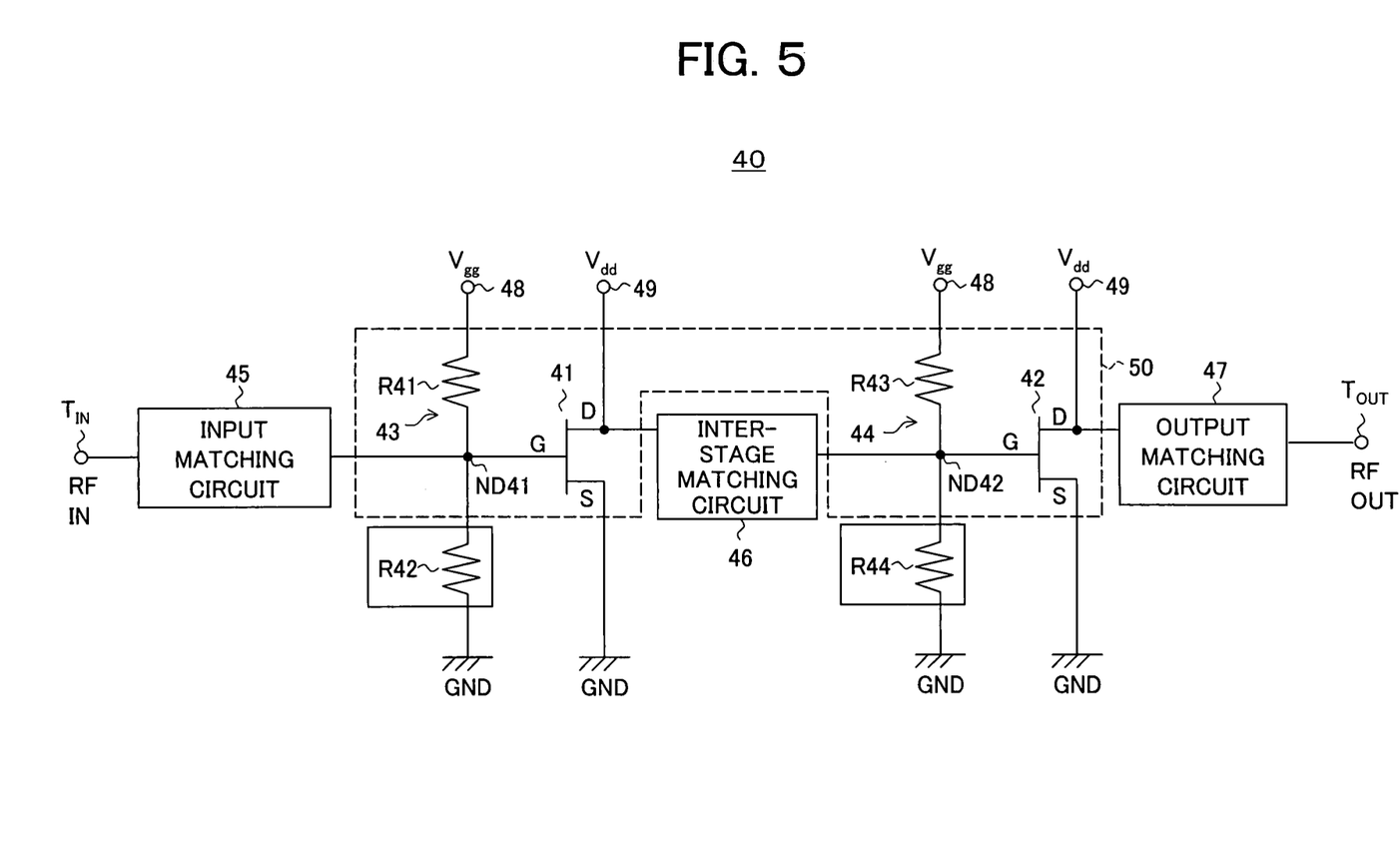
FIG. 5 is a circuit diagram of a power amplifier according to a fourth embodiment of the present invention.

FIG. 5 is a circuit diagram of a power amplifier according to a fourth embodiment of the present invention.

The power amplifier 40 according to the present forth embodiment is an example of the configuration of a concrete power amplifier module comprised of FETs arranged in a plurality of stages.

The power amplifier 40 has a plurality of FETs, for example the two FETs 41 and in this embodiment. The power amplifier 40 has, as shown in FIG. 5, a bias circuit 43 of the FET 41, a bias circuit 44 of the FET 42, an input matching circuit 45 connected between a connection point ND41 connected to a gate terminal G of the FET 41 of the bias circuit 43 and an input terminal TIN, an inter-stage matching circuit 46 connected to a drain terminal D of the FET 41 and a connection point ND42 connected to a gate terminal G of the FET 42 of the bias circuit 44, and an output matching circuit 47 connected between a drain terminal D of the FET 42 and an output terminal TOUT.

In the bias circuit 43, elements R41 and R42 are connected in series between a bias voltage supply terminal 48 supplied with a plus bias voltage Vgg and the ground potential GND, and the connection point ND41 of resistance elements R41 and R42 is connected to the gate terminal G of the FET 41. The drain terminal D of the TFT 41 is connected to a supply terminal 49 of the power source voltage Vdd, and a source terminal S of the FET 41 is grounded.

In the bias circuit 44, resistance elements R43 and R44 are connected in series between the bias voltage supply terminal 48 supplied with the plus bias voltage Vgg and the ground potential GND, and the connection point ND42 of resistance elements R43 and R44 is connected to the gate terminal G of the FET 41. The drain terminal D of the FET 41 is connected to the supply terminal 49 of the power source voltage Vdd, and a source terminal S of the FET 41 is grounded.

In the power amplifier 40 having the above configuration, the resistance elements R41 and R43 are constituted by compound semiconductor resistance elements formed on the same compound semiconductor substrate 50 as the FET 41 and FET 42. Both resistance values of the compound semiconductor devices R41 and R43 are set to 2.5 kΩ. Further, the resistance elements R42 and R44 are so-called chip resistors formed by metal coatings. Both resistance values of the chip resistance elements R42 and R44 are set to 500Ω.

The temperature coefficients of the compound semiconductor resistance elements R41 and R43 are set to 3500 ppm/° C. and the temperature coefficients of the compound semiconductor resistance elements R42 and R44 are set from −100 to 100 ppm/° C. In this way, the temperature coefficients of the compound semiconductor resistance elements R42 and R44 are small enough to be ignored in comparison with those of the compound semiconductor resistance elements R41 and R43.

Figure 6:
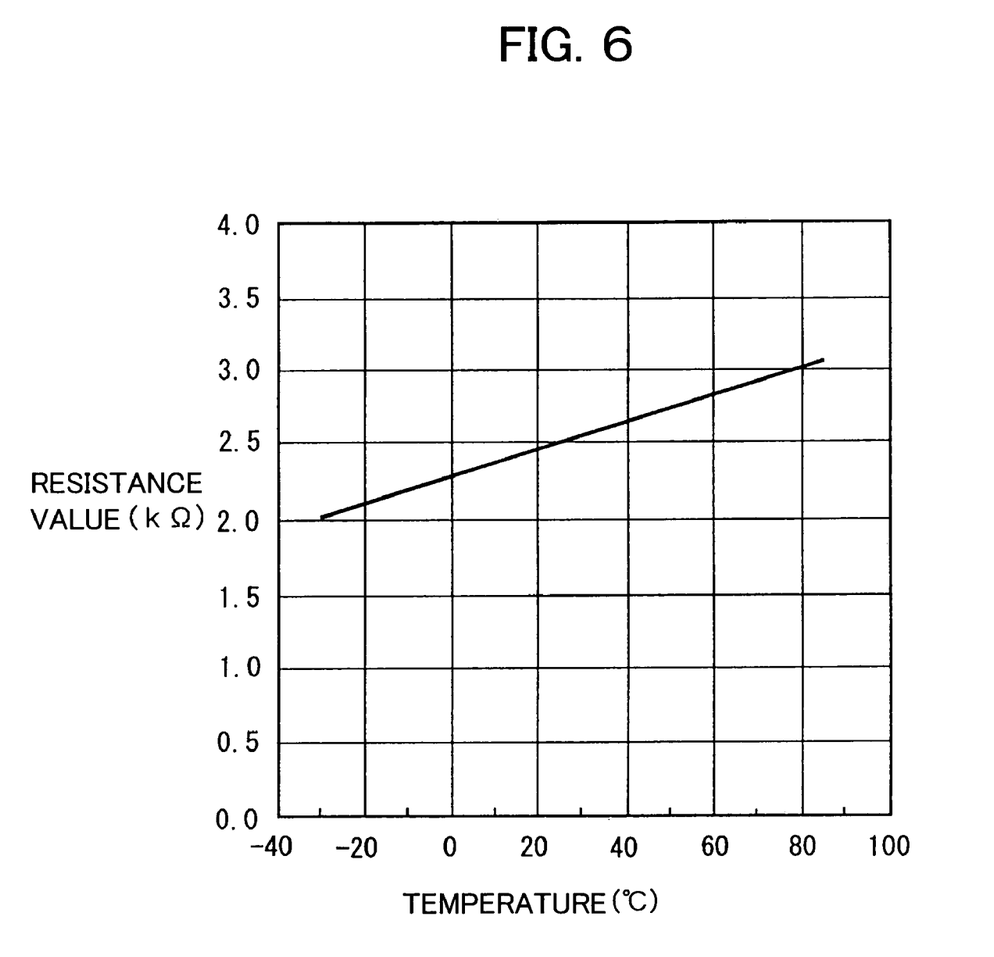
FIG. 6 is a view of the relationship between a resistance value of a resistance element R41 and the temperature at the power amplifier of FIG. 5 when a bias voltage Vgg is set to 2.7V and the temperature range of use is set from −30° C. to +85° C.

FIG. 6 is a view of the relationship between a resistance value of the resistance element R41 and the temperature, at the power amplifier of FIG. 5 when the bias voltage Vgg is set to 2.7V and the temperature range of use is set from −30° C. to +85° C. In FIG. 5, an abscissa represents the temperature T, and an ordinate represents the resistance value R.

Figure 7:
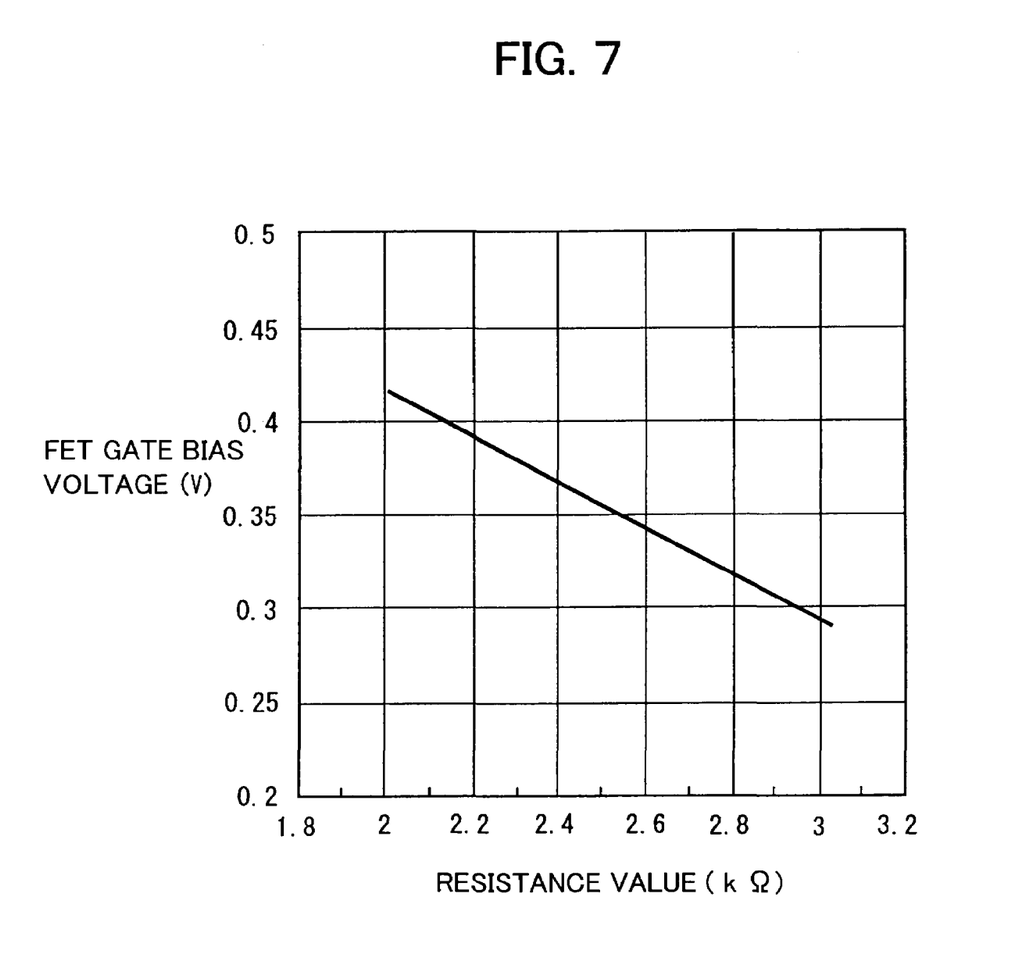
FIG. 7 is a view of the relationship between a resistance value of a resistance element R41 and a gate bias voltage Vg supplied to a gate of an FET at the power amplifier of FIG. 5.

Further, FIG. 7 is a view of the relationship between the resistance value of the resistance element R41 and the gate bias voltage Vg supplied to the gate of the FET at the power amplifier of FIG. 5. In FIG. 7, an abscissa represents the resistance value R, and an ordinate represents the gate bias voltage Vg. Note that the resistance element R43 has the same characteristics as the resistance element R41.

As will be understood from FIG. 7, the bias voltage Vg increases at a low temperature, while decreases at a high temperature. For example, when the temperature is 25° C., the voltage Vg is 0.35V, when it is −30° C., the voltage Vg is 0.42V, and when it is +85° C., the voltage Vg is 0.29V. Due to this, it is possible to obtain a temperature compensation effect of the power amplifier 40.

Further, as a characteristic showing the linearity of the power amplifier, there is the adjacent channel power ratio (ACPR) characteristic.

Figure 8:
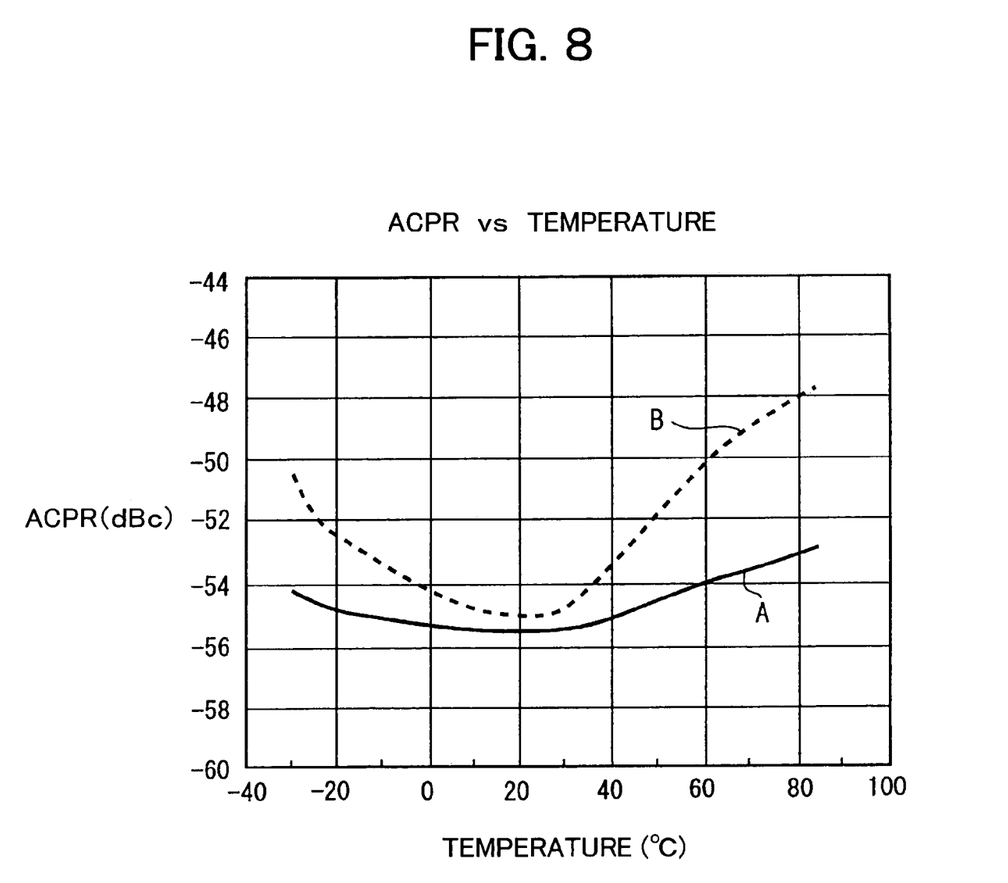
FIG. 8 is a view of an ACPR characteristic of a power amplifier with respect to the ambient temperature.

FIG. 8 is a view of the ACPR characteristic of the power amplifier with respect to the ambient temperature. In FIG. 8, an abscissa represents the temperature T, and an ordinate represents ACPR. Further, in FIG. 8, a curve indicated by A shows the ACPR characteristic of the power amplifier 40 according to the present embodiment, and a curve indicated by B shows the ACPR characteristic of a general power amplifier (related art).

The curve B of the general power amplifier shows that the ACPR is −55 dBc at 25° C., −50 dBc at −30° C., and −48 dBc at +85° C. Namely, there is a deterioration of 5 to 7 dB in the overall temperature range in a general power amplifier.

Contrary to this, the curve A of the power amplifier of the present embodiment shows that the ACPR is −55 dBc at 25° C., −54 dBc at −30° C., and −53 dBc at +85° C. The power amplifier of the present embodiment exhibits a good, flat characteristic in which the amount of change is within +2 dB over the entire temperature range and gives an excellent temperature compensation effect to the bias circuit.

Summarizing the effects of the invention, as explained above, according to the present invention, it is possible to minimize the deterioration of the linearity with respect to the ambient temperature. Further, since part of the resistance elements used for the bias circuit are formed on the same semiconductor substrate as the FETs, the size of the power amplifier can be reduced. Further, the resistance elements with small temperature coefficients are made resistance elements with variable resistance values so as to enable the optimum bias current to be set with respect to changes of the bias current due to fluctuation of the threshold values of the FETs.

While the invention has been described with reference to specific embodiments chosen for purpose of illustration, it should be apparent that numerous modifications could be made thereto by those skilled in the art without departing from the basic concept and scope of the invention.

What is claimed is:

1. A power amplifier comprising:
a field effect transistor,
a bias voltage supply terminal supplied with a positive bias voltage,
a reference potential,
a first resistance element, and
a second resistance element with a temperature coefficient smaller than that of the first resistance element, wherein
a first terminal of the first resistance element and a first terminal of the second resistance element are connected and the connection point of the first terminal of the first resistance element and the first terminal of the second resistance element is connected to a gate terminal of the field effect transistor,
a second terminal of the first resistance element is connected to the bias voltage supply terminal,
a second terminal of the second resistance element is connected to the reference potential,
the field effect transistor and the first resistance element are semiconductor devices formed on the same semiconductor substrate, and
a resistance value of the second resistance element is variable.

2. A power amplifier comprising:
a field effect transistor,
a bias voltage supply terminal supplied with a positive bias voltage,
a reference potential,
a first resistance element,
a second resistance element, and
a third resistance element with a temperature coefficient smaller than those of the first resistance element and the second resistance element, wherein
a first terminal of the first resistance element and a first terminal of the second resistance element are connected and the connection point of the first terminal of the first resistance element and the first terminal of the second resistance element is connected to a gate terminal of the field effect transistor,
a second terminal of the second resistance element is connected to a first terminal of the third resistance element,
a second terminal of the first resistance element is connected to the bias voltage supply terminal,
a second terminal of the third resistance element is connected to the reference potential,
the field effect transistor, the first resistance element, and the second resistance element are semiconductor devices formed on the same semiconductor substrate, and
a resistance value of the third resistance element is variable.

3. A power amplifier comprising:
a field effect transistor,
a bias voltage supply terminal supplied with a positive bias voltage,
a reference potential,
a first resistance element,
a second resistance element with a temperature coefficient smaller than that of the first resistance element, and
a third resistance element with a temperature coefficient smaller than that of the first resistance element, wherein
a first terminal of the first resistance element and a first terminal of the second resistance element are connected, a second terminal of the second resistance element and a first terminal of the third resistance element are connected, a connection point of the second terminal of the second resistance element and the first terminal of the third resistance element is connected to a gate terminal of the field effect transistor, a second terminal of the first resistance element is connected to the bias voltage supply terminal, a second terminal of the third resistance element is connected to the reference potential, the field effect transistor and the first resistance element are semiconductor devices formed on the same semiconductor substrate, and a resistance value of the third resistance element is variable.

4. The power amplifier as set forth in claim 1, wherein a bias current of the field effect transistor can be set voluntarily via the variable resistance value of the second resistance element.

5. The power amplifier as set forth in claim 2, wherein a bias current of the field effect transistor can be set voluntarily via the variable resistance value of the third resistance element.

6. The power amplifier as set forth in claim 3, wherein a bias current of the field effect transistor can be set voluntarily via the variable resistance value of the third resistance element.

7. The power amplifier as set forth in claim 1, wherein linearity of the power amplifier is independent from ambient temperature.

8. The power amplifier as set forth in claim 2, wherein linearity of the power amplifier is independent from ambient temperature.

9. The power amplifier as set forth in claim 3, wherein linearity of the power amplifier is independent from ambient temperature.

* * * * *